(12) United States Patent
Lee et al.

(10) Patent No.: US 10,916,167 B2
(45) Date of Patent: Feb. 9, 2021

(54) GATE DRIVING DEVICE AND DISPLAY DEVICE HAVING THE SAME

(71) Applicant: SAMSUNG DISPLAY CO., LTD., Yongin-si (KR)

(72) Inventors: Dae-Sik Lee, Hwaseong-si (KR); Yanguk Nam, Hwaseong-si (KR); Yoomi Kim, Hanam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 59 days.

(21) Appl. No.: 16/248,112

(22) Filed: Jan. 15, 2019

(65) Prior Publication Data

US 2019/0251888 A1 Aug. 15, 2019

(30) Foreign Application Priority Data

Feb. 14, 2018 (KR) .......................... 10-2018-0018556

(51) Int. Cl.
*G09G 3/20* (2006.01)
*G09G 3/36* (2006.01)
(Continued)

(52) U.S. Cl.
CPC ............. *G09G 3/20* (2013.01); *G09G 3/3677* (2013.01); *G02F 1/136286* (2013.01);
(Continued)

(58) Field of Classification Search
CPC ...... G09G 3/20; G09G 3/3677; G09G 3/3266; G09G 2300/0426; G09G 2310/0243;
(Continued)

(56) References Cited

U.S. PATENT DOCUMENTS 9,646,526 B2 5/2017 Sun
2010/0156869 A1 6/2010 Lee et al.
(Continued)

FOREIGN PATENT DOCUMENTS

KR 1020170114067 10/2017

OTHER PUBLICATIONS

European Search Report dated Apr. 10, 2019 in corresponding European Application No. 19157159.5 (17 pages).

*Primary Examiner* — Lixi C Simpson
(74) *Attorney, Agent, or Firm* — F. Chau & Associates, LLC (57) ABSTRACT

A gate driving device of a display device may include a voltage generator, a gate controller and a gate driver. The voltage generator may generate a gate driving voltage that varies between a gate-on voltage and a gate-off voltage. The gate controller may generate gate clock signals based on the gate driving voltage and gate control signals. The gate driver may generate a gate signal based on the gate clock signals. The gate control signals may include a first control signal and clock control signals, each varying between a high level and a low level. The gate controller may output the gate clock signals having a voltage level of the gate-off voltage when the first control signal and the clock control signals are each provided to the gate controller at the low level, thereby avoiding a display defect due to voltage ramping that may otherwise occur.

21 Claims, 8 Drawing Sheets

(51) Int. Cl.
  *G02F 1/1362* (2006.01)
  *H01L 27/32* (2006.01)
  *G09G 3/3266* (2016.01)

(52) U.S. Cl.
  CPC ... *G09G 3/3266* (2013.01); *G09G 2300/0426* (2013.01); *G09G 2310/0243* (2013.01); *G09G 2310/0267* (2013.01); *G09G 2310/08* (2013.01); *H01L 27/3276* (2013.01)

(58) Field of Classification Search
  CPC ...... G09G 2310/0267; G02F 1/136286; H01L 27/3276
  See application file for complete search history.

(56) References Cited

U.S. PATENT DOCUMENTS

| | | | |
|---|---|---|---|
| 2010/0220079 A1* | 9/2010 | Bang | G09G 3/3696 345/204 |
| 2012/0068994 A1 | 3/2012 | Li et al. | |
| 2014/0049532 A1* | 2/2014 | Choi | G09G 5/00 345/213 |
| 2014/0340380 A1* | 11/2014 | Song | G09G 3/3473 345/212 |
| 2015/0187247 A1* | 7/2015 | Lee | G09G 3/20 345/205 |
| 2017/0039974 A1 | 2/2017 | Kang et al. | |
| 2017/0206847 A1 | 7/2017 | Park et al. | |

\* cited by examiner

GATE DRIVING DEVICE AND DISPLAY DEVICE HAVING THE SAME

CROSS-REFERENCE TO RELATED APPLICATION(S)

This application claims priority under 35 USC § 119 to Korean Patent Application No. 10-2018-0018556, filed on Feb. 14, 2018 in the Korean Intellectual Property Office (KIPO), the contents of which are incorporated herein by reference in its entirety.

BACKGROUND

1. Technical Field

Example embodiments relate generally to a gate driving device and a display device having the same, and more particularly to a gate driving device that provides a plurality of gate clock signals at different phases to a display panel.

2. Discussion of the Related Art

Flat panel display (FPD) devices have proliferated in recent years due to technological advances to achieve higher resolution, better image quality, reduced power consumption, thin profiles, and manufacturing advances to reduce cost. Examples of FPD devices include liquid crystal display (LCD) devices, field emission display (FED) devices, plasma display panel (PDP) devices, and organic light emitting display (OLED) devices.

An FPD device includes a display panel that displays an image and a driver to drive the display panel. For example, the LCD device may include a liquid crystal display panel that includes pixels formed in intersection regions of a plurality of data lines and a plurality of gate lines, a gate driving circuit that outputs a gate signal to the gate lines, and a data driving circuit that outputs data signals to the data lines.

Recently, a method that integrates the gate driving circuit on a substrate is used in order to decrease a size of the display panel and in order to increase productivity. The number of parts, volume, and production costs of the display device may decrease by directly forming the gate driving circuit on the substrate of the display panel.

SUMMARY

Disclosed are embodiments of display device with a gate driving device capable of improving display quality over conventional display devices.

According to an aspect, a display device may include a display panel including a plurality of gate lines, a plurality of data lines crossing the gate lines, and a plurality of pixels coupled to the gate lines and the data lines, a voltage generator configured to generate a gate driving voltage that varies between a gate-on voltage and a gate-off voltage, a gate controller configured to generate gate clock signals based on the gate driving voltage and gate control signals, a gate driver configured to generate gate signals based on the gate clock signals and provide the gate signals to the gate lines, a data driver configured to provide data signals to the data lines, and a timing controller configured to provide the gate control signals to the gate controller and provide data control signals to the data driver. The gate control signals may include a first control signal and clock control signals, each varying between a high level and a low level. The gate controller may output the gate clock signals having a voltage level of the gate-off voltage when the first control signal and the clock control signals are each provided to the gate controller at the low level.

In various example embodiments:

The clock control signals may include a first clock control signal and a second clock control signal, and the gate controller may generate a gate start signal based on the gate driving voltage and the first control signal, generate a first clock signal and a first clock bar signal based on the gate driving voltage and the first clock control signal, and generate a second clock signal and a second clock bar signal based on the gate driving voltage and the second clock control signal.

The gate controller may output the first clock signal, the first clock bar signal, the second clock signal, and the second clock bar signal having the voltage level of the gate-off voltage when the first control signal, the first clock control signal, and the second clock control signal are provided to the gate controller at the low level.

The gate controller may include a first OR gate configured to perform a logic operation of the first clock control signal and the second clock control signal and a second OR gate configured to perform a logic operation of the first control signal and an output signal of the first OR gate.

The gate controller may output the first clock signal, the first clock bar signal, the second clock signal, and the second clock bar signal having the voltage level of the gate-off voltage in a blank period of a frame.

The gate controller may output the first clock signal, the first clock bar signal, the second clock signal, and the second clock bar signal at the voltage level of the gate-off voltage when the timing controller is operated in a fail mode.

The gate controller may output the first clock signal, the first clock bar signal, the second clock signal, and the second clock bar signal having the voltage level of the gate-off voltage based on a blank signal having a low level in a blank period of a frame.

The gate driver may generate the gate signals based on the first clock signal, the first clock bar signal, the second clock signal, and the second clock bar signal.

Each of the first clock signal, the first clock bar signal, the second clock signal, and the second clock bar signal may swing between the gate-on voltage and the gate-off voltage.

The gate controller may output the gate clock signal having the voltage level of the gate-off voltage in a blank period of a frame.

The gate controller may output the gate clock signals at the voltage level of the gate-off voltage when the timing controller operates in a fail mode.

According to an aspect, a gate driving device may include a voltage generator configured to generate a gate driving voltage that includes a gate-on voltage and a gate-off voltage, a gate controller configured to generate gate clock signals based on the gate driving voltage and gate control signals, and a gate driver configured to generate a gate signal based on the gate clock signals. The gate control signals may include a first control signal and clock control signals. The gate controller outputs the gate clock signals having a voltage level of the gate-off voltage when the first control signal and the clock control signals having a low level is provided to the gate controller.

Therefore, the gate driving device and the display device having the same may include a gate driver that generates the gate signal and the gate controller that generates the gate clock signals that controls the gate driver. The gate controller may output the gate clock signals at the voltage level of the gate-off voltage when the first control signal and clock control signals are provided to the gate controller at the low level, so as to prevent a voltage level increase of the gate clock signals due to charge sharing of the gate-on voltage and the gate-off voltage. Thus, display quality of the display device may improve.

In another aspect, a gate controller may include: (i) a detection circuit configured to detect a start of at least one of a blank period or a fail mode and provide an output signal indicative thereof; and (ii) a gate clock setting circuit configured to generate a plurality of gate clock signals responsive to control signals received thereby. The gate clock setting circuit may set each of the gate clock signals to a gate-off voltage level if the output signal indicates that the blank period or fail mode has started.

BRIEF DESCRIPTION OF THE DRAWINGS

Illustrative, non-limiting example embodiments will be more clearly understood from the following detailed description taken in conjunction with the accompanying drawings, in which like reference characters indicate like elements or operations, wherein.

DETAILED DESCRIPTION OF EMBODIMENTS

Hereinafter, the present inventive concept will be explained in detail with reference to the accompanying drawings.

Figure 1:
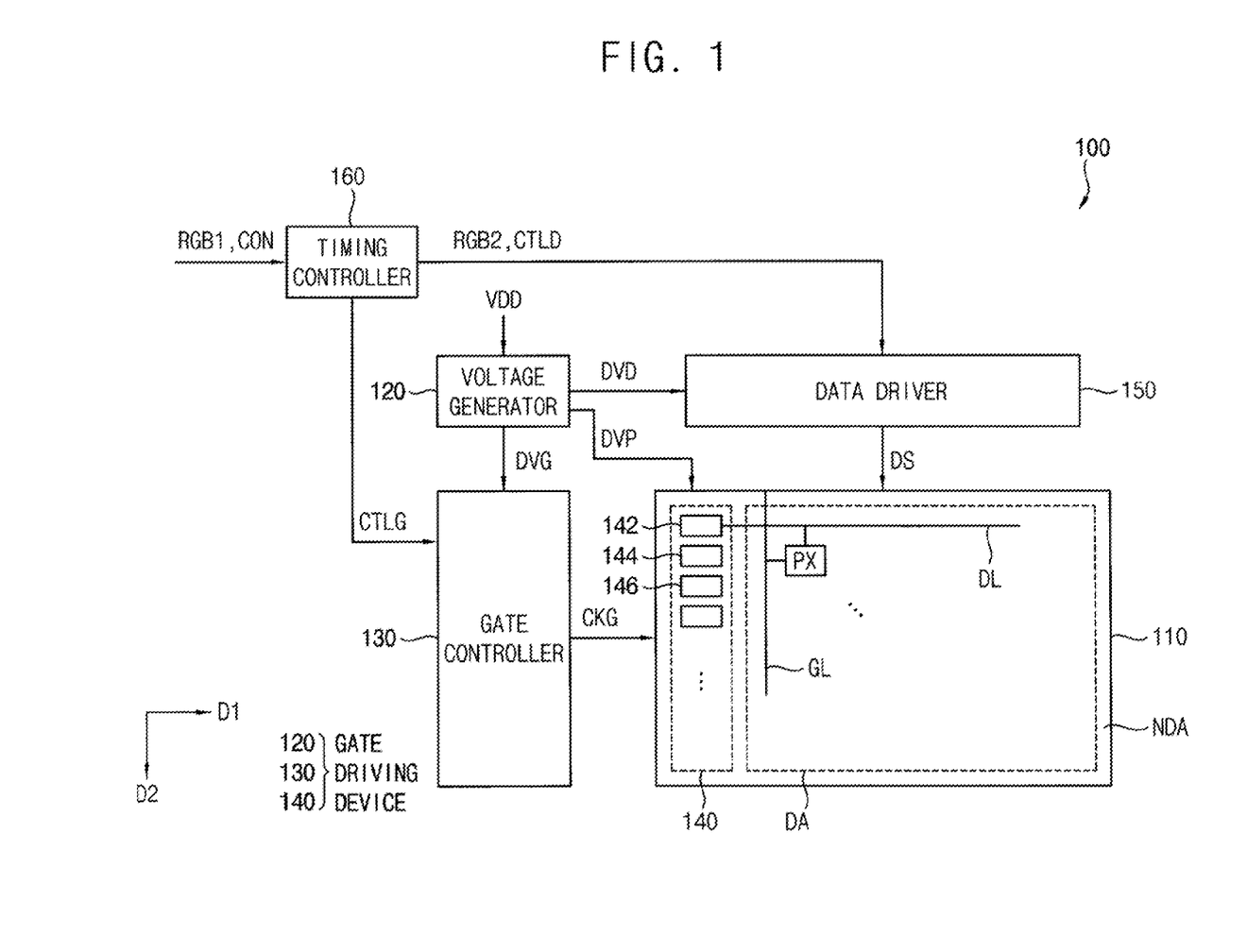
FIG. 1 is a block diagram illustrating a display device according to example embodiments.
Figure 2:
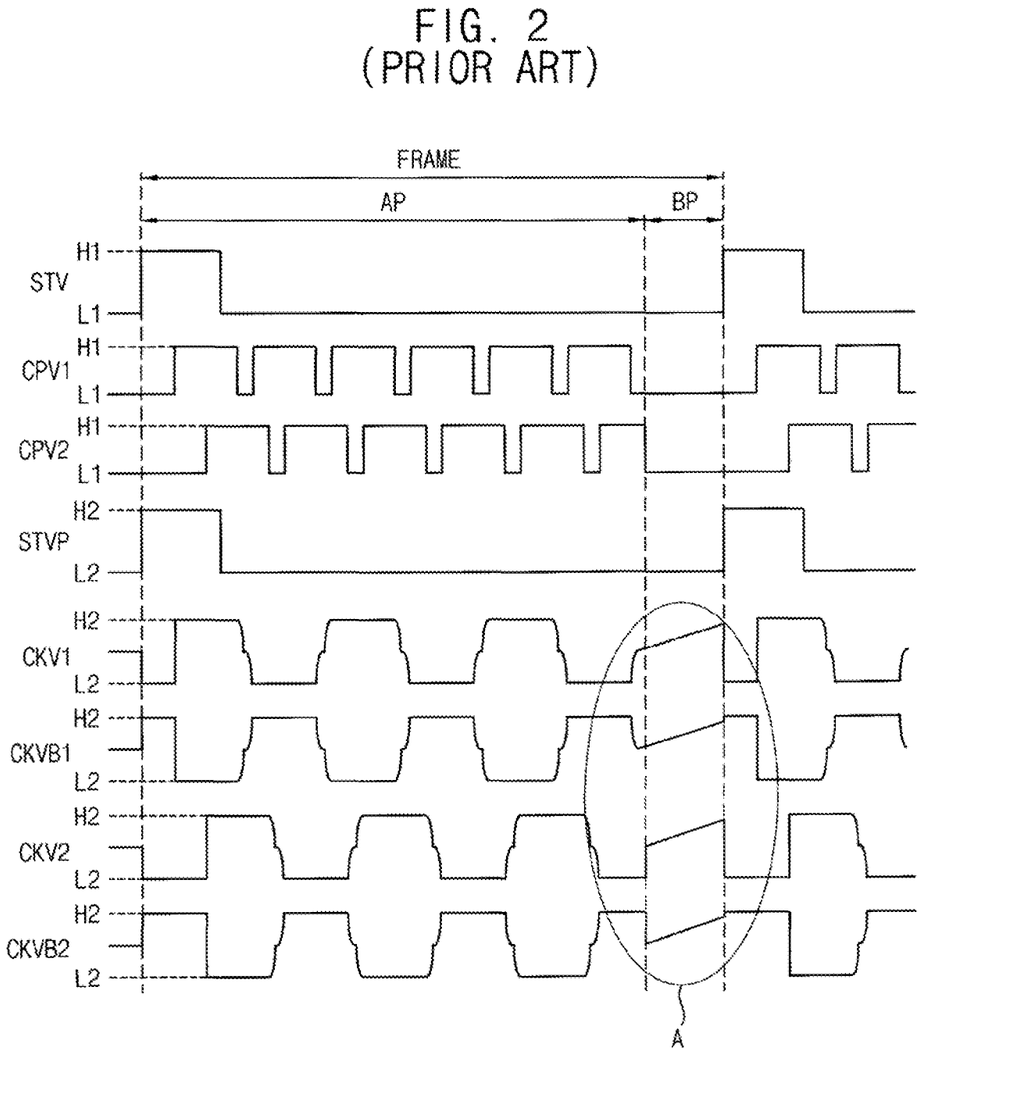
FIG. 2 is a timing diagram illustrating for describing an operation of a gate controller included in a prior art device.
Figure 3:
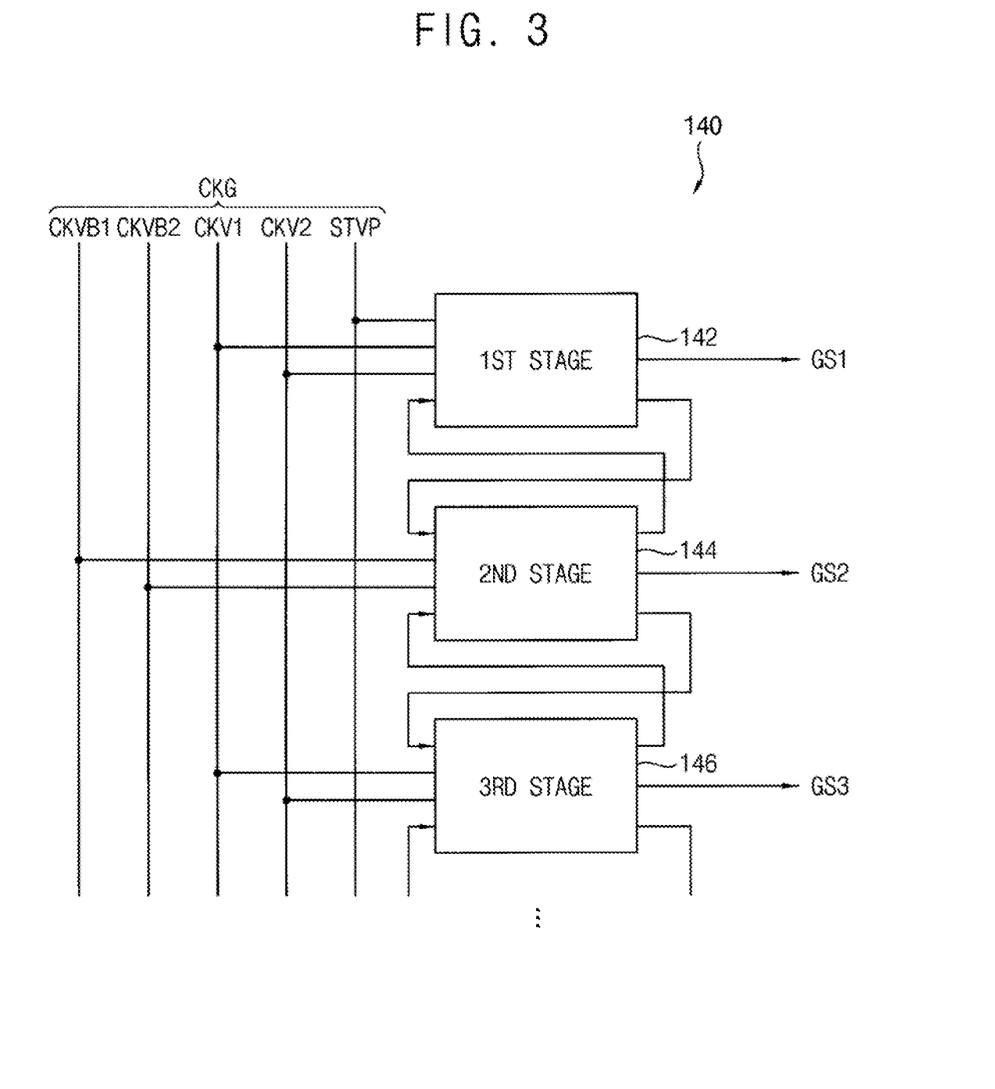
FIG. 3 is a diagram illustrating an example of a gate driver included in the display device of FIG. 1.

FIG. 1 is a block diagram illustrating a display device according to example embodiments. FIG. 2 is a timing diagram illustrating an operation of a gate controller in the prior art. FIG. 3 is a diagram illustrating an example of a gate driver included in the display device of FIG. 1.

Referring to FIG. 1, a display device 100 may include a display panel 110, a voltage generator 120, a gate controller 130, a gate driver 140, a data driver 150, and a timing controller 160. Voltage generator 120, gate controller 130 and gate driver 140 together constitute an example of a gate driving device in accordance with the inventive concept.

The display panel 110 may include a plurality of data lines DL, a plurality of gate lines GL, and a plurality of pixels PX. The gate lines GL may each extend in a first direction D1 and be arranged with respect to each other in a second direction D2 substantially perpendicular to the first direction D1. The data lines DL may extend in the second direction D2 and be arranged in the first direction D1. (Although a single gate line GL, a single data line DL and a single pixel PX are shown for clarity of illustration, there may be n gate lines GL, m data lines DL and m×n pixels PX each electrically connected to one of the gate lines GL and one of the data lines DL, where m and n are integers set for a particular display panel configuration.) The first direction D1 may be parallel with a long side of the display panel 220, and the second direction D2 may be parallel with the short side of the display panel 220. Each of the pixel 221 may be formed in an intersection region of the data line DL and the gate line GL. In some example embodiments, each of the pixels may include a thin film transistor electrically coupled to the gate line GL and the data line DL, a liquid crystal capacitor and a storage capacitor coupled to the thin film transistor. Thus, the display panel 110 may be a liquid crystal display panel and the display device 100 may be a liquid crystal display device. In other example embodiments, each of the pixels PX may include a thin film transistor electrically coupled to the gate line GL and the data line DL, a storage capacitor coupled to the thin film transistor, a driving transistor coupled to the storage capacitor, and an organic light emitting diode coupled to the driving transistor. Thus, the display panel 110 may be an organic light emitting display panel, and the display device 100 may be an organic light emitting display device 100. The display panel 110 may include a display area DA and a non-display area NDA. The plurality of pixels PX may be formed in the display area DA. The pixels PX in the display area DA may display an image. Circuits and lines for generating or providing signals to drive the pixels PX may be formed in the non-display area NDA.

The voltage generator 120 may receive a direct current (DC) voltage VDD from an external device and generate a plurality of voltages for driving the display panel 110. The voltage generator 120 may generate a gate driving voltage DVG which is provided to the gate controller 130, a data driving voltage DVD provided to the data driver 150, and a panel driving voltage DVP provided to the display panel 110. The gate driving voltage DVG may swing between a gate-on voltage and a gate-off voltage. The gate driving voltage DVG is a driving voltage to generate a gate signal applied to the gate lines GL. The voltage generator 120 may generate the data driving voltage DVG that includes an analog power voltage, a digital power voltage, etc. and provide the data driving voltage DVG to the data driver 150. The analog power voltage and/or the digital power voltage may constitute a driving voltage to generate the data signal DS applied to the data lines DL. The voltage generator 120 may generate the panel driving voltage DVP that includes a common voltage, a storage voltage, etc. and provide the panel driving voltage DVP to the display panel 110. The common voltage may be a driving voltage applied to the liquid crystal capacitor included in the pixel PX, and the storage voltage may be a driving voltage applied to the storage capacitor included in the pixel PX. The common voltage and the storage voltage may be voltages of the same level.

The gate controller 130 may generate gate clock signals CKG based on the gate driving voltage DVG and gate control signals CTLG. The gate controller 130 may receive the gate driving voltage DVG that swings between the gate-on voltage and the gate-off voltage from the voltage generator 120. The gate controller 130 may receive the gate control signals CTLG that include a first control signal (i.e., a vertical start signal) and clock control signals. The gate controller 130 may generate a gate start signal using the gate-on voltage and the gate-off voltage in response to the first control signal provided from the timing controller 160.

The gate controller 130 may generate clock signals and clock bar signals using the gate-on voltage and the gate-off voltage in response to the clock control signals provided from the timing controller 160. The gate controller 130 may receive at least one clock control signal from the timing controller 160. For example, the gate controller 130 may receive the first clock control signal and the second clock control signal from the timing controller 160. Alternatively, the gate controller 130 may include a signal generator, receive one clock control signal from the timing controller 160, and generate the first clock control signal and the second control signal through the signal generator. The second clock control signal may be a signal delayed from the first clock control signal.

The gate controller 130 may generate a first clock signal and a first "clock bar" signal (an inverse signal of the first clock signal) using the gate-on voltage and the gate-off voltage in response to the first clock control signal. Gate controller 120 may generate a second clock signal and a second "clock bar" signal (an inverse signal of the second clock signal) using the gate-on voltage and the gate-off voltage in response to the second clock control signal. Each of the first clock signal, the first clock bar signal, the second clock signal, and the second clock bar signal may swing between the gate-on voltage and the gate-off voltage. The first and second clock signals may be offset in phase and may be used to drive different respective gate line regions of the display panel. This allows for better synchronization of the gate signals with the data signals due to different propagation delays of the data signals to reach the different regions of the display panel. Note that in other embodiments, a larger number of gate clock signals, such as four gate clock signals (along with four gate clock bar signals) for driving four respective gate line regions, may be generated.

Referring to FIG. 2, the gate start signal STVP may be activated at a start timing of a frame which coincides with the start of an active period AP of the frame. During the active period AP, data voltages are applied to the pixels row by row as gate lines GL are sequentially activated via the gate clock signals. The gate start signal STVP is a pulsed signal having a gate-on voltage H2 in response to the first control signal STV. The gate start signal STVP may have the gate-off voltage L2 during the remainder of the active period AP and throughout a blank period BP of the frame. Here, the gate-off voltage L2 may be lower than a low level L1 of the first control signal STV, and the gate-on voltage H2 may be higher than a high level H1 of the first control signal STV.

A first clock control signal CPV1 and a second clock control signal CPV2 may swing between the high level H1 and the low level L1 during the active period and have the low level L1 during the blank period. A first clock signal CKV1 and a first clock bar signal CKVB1 may swing between the gate-on voltage H2 and the gate-off voltage L2 in response to the first clock control signal CPV1 during the active period AP. Here, the first clock signal CKV1 and the first clock bar signal CKVB1 may have an opposite phase. A second clock signal CKV2 and a second clock bar signal CKVB2 may swing between the gate-on voltage H2 and the gate-off voltage L2 in response to the second control signal CPV2 during the active period AP. Here, the second clock signal CKV2 and the second clock bar signal CKVB2 may have an opposite phase.

Abbreviations

Hereafter, the following abbreviations for the corresponding phrases may be used for brevity and clarity of explanation:
CKV1—"the first clock signal CKV1";
CKVB1—"the first clock bar signal CKVB1";
CKV2—"the second clock signal CKV2";
CKVB2—"the second clock bar signal";
the CKV Signals—"the first clock signal CKV1, the first clock bar signal CKVB1, the second clock signal CKV2, and the second clock bar signal CKVB2";
CPV1—"the first clock control signal CPV1"
CPV2—"the second clock control signal CPV2"
STV—"the first control signal STV";
L1—"the low level L1";
H1—"the high level H1";
L2—"the gate-off voltage L2";
H2—"the gate-on voltage H2";
STVP—"the gate start signal STVP".

Referring still to FIG. 2, the gate-off voltage L2 of the CKV Signals may be lower than the low level L1 of CPV1 and CPV2. The gate-on voltage H2 of the CKV Signals may be higher than the high level H1 of CPV1 and CPV2.

As shown in region "A" in FIG. 2, during the blanking period BP, in the prior art, the CKV Signals may each have a time varying voltage level that continually ramps up during this period. This voltage variation is due to a charge sharing of the gate-on voltage H2 and the gate-off voltage L2 in the gate controller 130 as the time of the blank period BP progresses. The gate driver 140 may be unintentionally operated in response to the CKV Signals as the voltage level of the CKV Signals ramps beyond a certain level. As a result, unwanted voltages may be applied to the pixels PX, causing display defects to be displayed on the display panel 110 in the blank period.

As described in detail below, the display device 100 according to embodiments of the inventive concept may prevent the display defects displayed on the display panel 110 in the blank period by outputting the gate clock signal CKG with the CKV Signals having the gate-off voltage L2. That is, the CKV Signals are held to the low level L2 when each of the first control signal STV and the clock control signals CPV1, CPV2 fall to the low level L1, which occurs at the start of the blank period BP or during a "fail mode" discussed later.

Accordingly, as will be seen later in connection with FIG. 5A, for example, the gate controller 130 may output the CKV Signals having the gate-off voltage L2 when each of STV, CPV1, and CPV2 at the low level L1 are provided to the gate controller 130. The gate controller 130 may have a suitable circuit for detecting this condition as described below in connection with FIG. 4A.

Figure 5A:
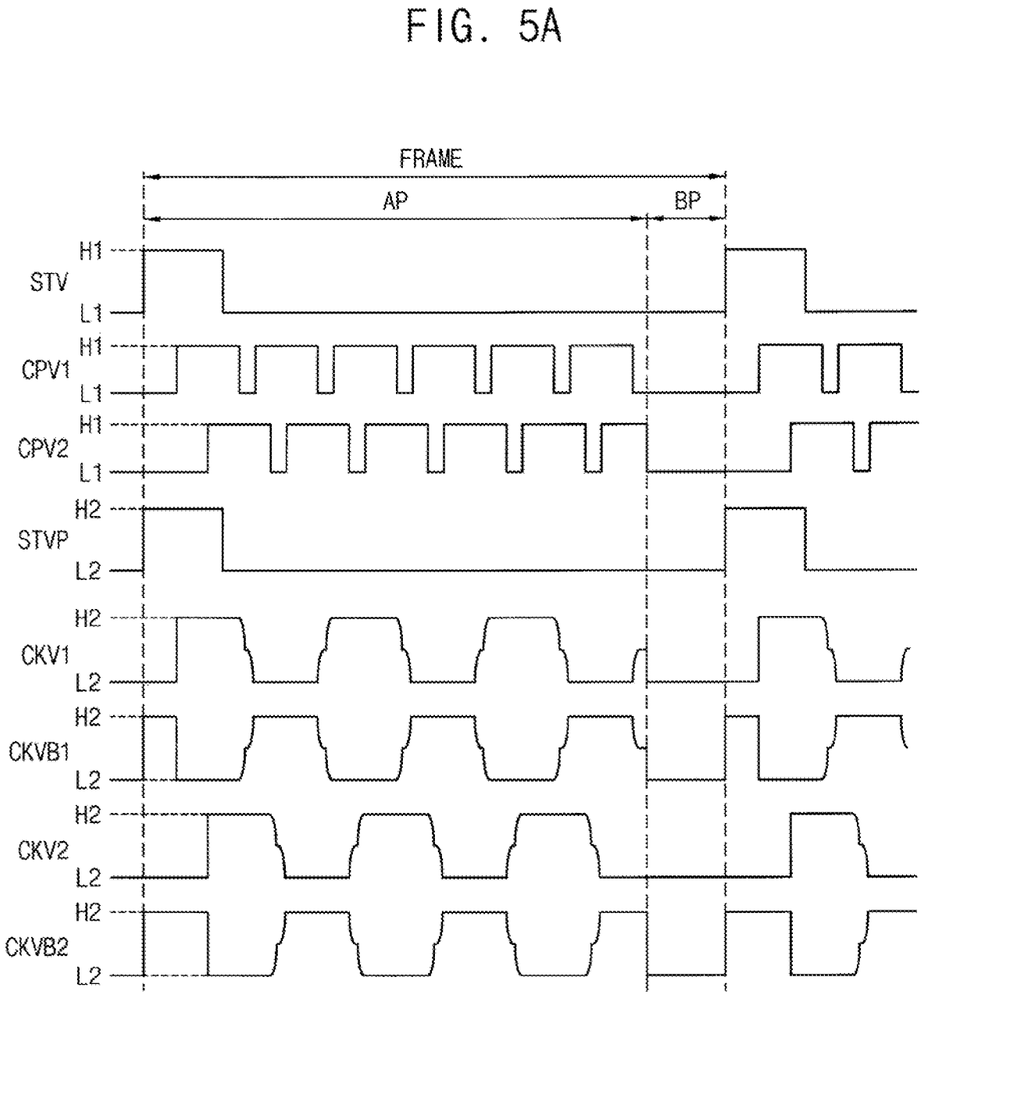
FIGS. 5A and 5B are respective timing diagrams illustrating examples of operations of the gate controller included in the display device of FIG. 1.

Referring temporarily to FIG. 5A, in an embodiment, each of STV, CPV1, and CPV2 at the low level L1 may be provided to the gate controller 130 in the blank period BP of the frame. The gate controller 130 may generate the CKV Signals having the gate-off voltage L2 based on STV, CPV1, and CPV2 having the low level L1 during the blank period BP before the next active period AP starts.

Figure 5B:
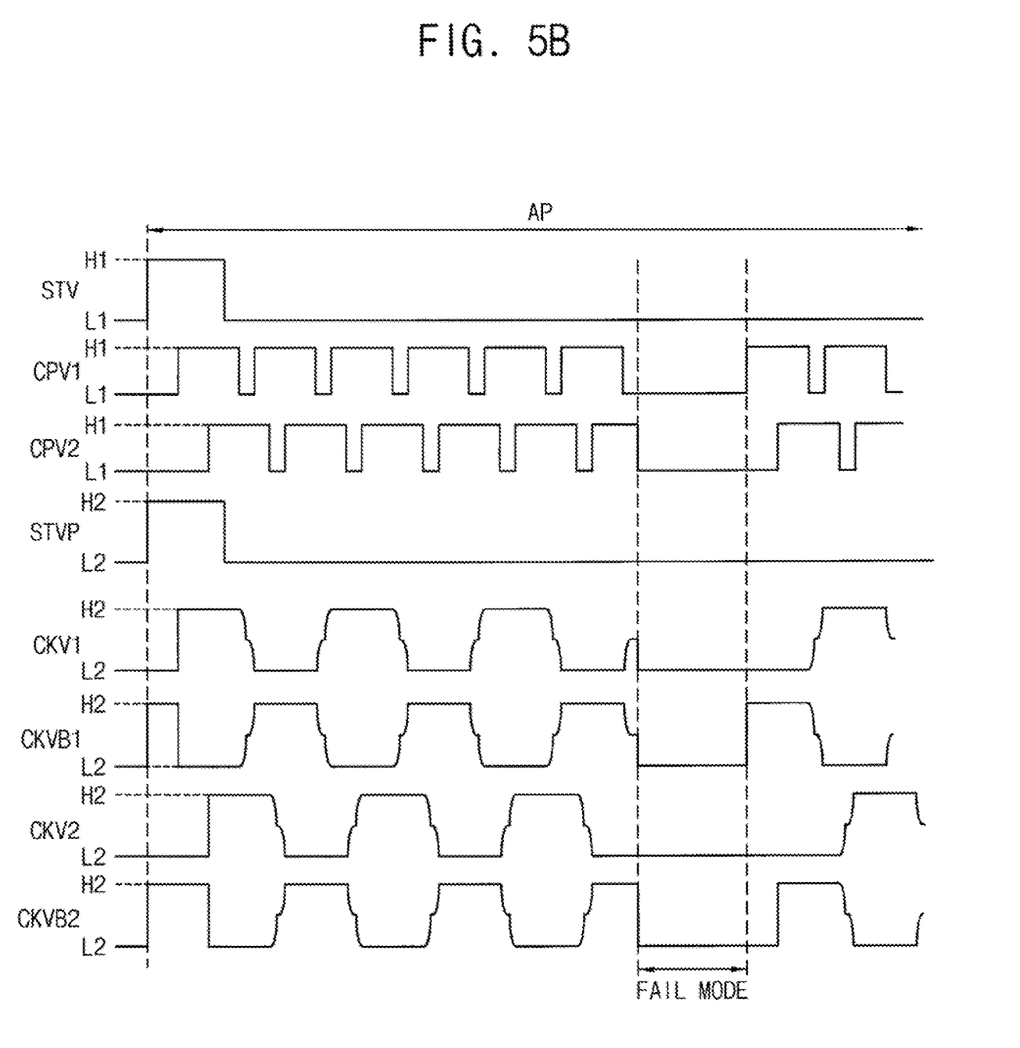

Referring momentarily to FIG. 5B, in another embodiment or operating condition, each of STV, CPV1, and CPV2 may be provided to the gate controller 130 at the low level L1 when the timing controller 160 is operated in a fail mode due to a changing of frequency, electrostatic discharge (ESD), etc. in the active period AP. In this case, gate controller 130 may generate the CKV Signals having the gate-off voltage L2 based on STV, CPV1, and CPV2 being at the low level L1, before they all rise to the high level H1. In another embodiment (illustrated in FIG. 6), the gate controller 130 may output the CKV Signals having the gate-off voltage L2 based on a blank signal having the low level L1 in the blank period BP. For example, the blank signal may be provided from the timing controller 160. Further, the blank signal may mask the CKV Signals as the gate-off voltage L2. Below, the gate controller 130 will be described in detail referring to FIG. 4A through FIG. 6.

The gate driver 140 may generate the gate signal based on the gate clock signals CKG and provide the gate signal to the pixels PX through the gate lines GL. The gate driver 140 may be formed in the non-display area NDA of the display panel 110. The gate driver 140 may sequentially output the plurality of gate signals synchronized with the gate start signal STVP, the first clock signal CKV1, the first clock bar signal CKVB1, the second clock signal CKV2, and the second clock bar signal CKVB2.

Referring to FIG. 3, the gate driver 140 may include a plurality of stages 142, 144, 146. Each of the stages may receive the gate clock signals CKG that includes the gate start signal STVP, the first clock signal CKV1, the first clock bar signal CKVB1, the second clock signal CKV2, and the second clock bar signal CKVB2. Each of the stages 142, 144, 146 may be electrically coupled to one terminal of the gate lines GL. The first stage 142 may generate a first gate signal GS1 provided to a first gate line GL1 in response to STVP, CKV1, and CKV2. The second stage 144 may generate a second gate signal GS2 provided to a second gate line GL2 in response to a carry signal provided from the first stage 142, CKVB1, and CKVB2. The third stage 146 may generate a third gate signal GS3 provided to a third gate line GL3 in response to a carry signal provided from the second stage 144, CKV1 and CKV2. The other stages of the gate driver 140 (not shown, up to stage N where N is any integer) may sequentially provide the gate signals using the same method.

It is noted here that in FIG. 1, the voltage generator 120, the gate controller 130, and the gate driver 140 are shown as separate elements. In an embodiment, the voltage generator 120, the gate controller 130, and the gate driver 140 may be integrated to a common gate driving device (e.g., an integrated circuit).

The data driver 150 may provide the data signals DS to the pixels PX through the data lines DL. The data driver 150 may generate data signals DS based on the data control signal CTLD and the second image data RGB2 provided from the timing controller 160. The data control signal CTLD may include a horizontal start signal and a data clock signal. The data driver 150 may output the data signals DS corresponding to the second image data RGB2 to the data lines DL of the display panel 110 in response to the horizontal signal and the data clock signal provided from the timing controller 160.

The timing controller 160 may generate the gate control signal CTLG that controls the gate controller 130 and the data control signal CTLD that control the data driver 150. The timing controller 160 may convert a first image data RGB1 provided from an external device to the second image data RGB2, and generate the gate control signal CTLG and the data control signal CTLD that control a driving timing of the first image data RGB1. The timing controller 160 may receive a control signal CON from the external device and generate the gate control signal CTLG that includes STV, CPV1, and CPV2. Further, the timing controller 160 may generate the data control signal CTLD that includes the horizontal start signal and the data clock signal. The timing controller 160 may provide the gate control signal CTLG that includes STV, CPV1, and CPV2 to the gate controller 130 and provide the data control signal CTLD that includes the horizontal start signal and the data clock signal to the data driver 150.

As described above, the display device 100 of FIG. 1 may include the gate driver 140 that generates the gate signal and the gate controller 130 that generate the gate clock signals CKG that control the gate driver 140. The gate controller 130 may output the gate clock signals CKG having the gate-off voltage L2 when the first control signal STV and the clock control signals CPV1, CPV2 having the low level L1 are provided to the gate controller 130. Thus, the ramping of the voltage level of the CKV Signals of the gate clock signals CKG due to the charge sharing of the gate-on voltage H2 and the gate-off voltage L2 may be prevented. Therefore, the display quality of the display panel 100 may improve.

Figure 4A:
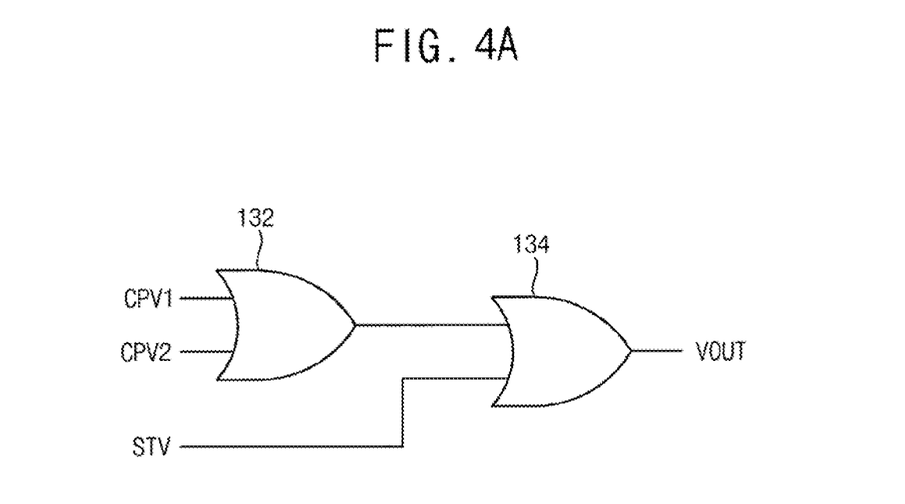
FIG. 4A is a diagram illustrating an example of a detection circuit that may be included within the gate controller shown in FIG. 1.

FIG. 4A is a diagram illustrating an example of a detection circuit, 400, included within gate controller 130 in the display device of FIG. 1. Detection circuit 400 may be configured to output an output signal VOUT which has a logic level based on the values of STV, CPV1 and CPV2. When all of STV, CPV1 and CPV2 are at a logic low L1, detection circuit 400 detects this condition as either the onset of the blank period BP or the fail mode, and outputs VOUT at a first logic level, e.g., logic low. Otherwise, VOUT is output at an opposite logic level.

Detection circuit 400 may include a first OR gate 132 and a second OR gate 134. The first OR gate 132 may perform a logic operation on CPV1 and CPV2. That is, the first OR gate 132 may output a signal having a low level when each of CPV1 and CPV2 are logic low (L1), and output a signal having a high level when at least one of the CPV1 and CPV2 is at logic high (e.g., H1). As mentioned above, in other embodiments, N clock signals, e.g., four clock signals, may be provided to different gate line regions of the display panel. In this case, the first OR gate 132 may receive first through N clock control signals. The first OR gate 132 may output a signal VOUT having the low level when the first through N clock control signals have the low level and output a signal having the high level when at least one of the first through N clock control signals has the high level.

The second OR gate 134 may perform a logic operation on an output signal of the first OR gate 132 and the first control signal STV. That is, the second OR gate 134 may output a signal having the low level as an output signal VOUT when the output signal of the first OR gate 132 and the first control signal SW have the low level and output the signal having the high level as the output signal VOUT when at least one of the output signal of the first OR gate 132 and the first control signal SW has the high level. When the output signal VOUT of the second OR gate 134 is the low level, the gate controller may output the CKV Signals at the voltage level of the gate-off voltage (L2).

It is noted that other logic gate configurations may be used to achieve the input-output logic outcome of detection circuit 400. For instance, logic circuits employing different types of logic gates, such as AND, NAND or NOR gates may be substituted.

Figure 4B:
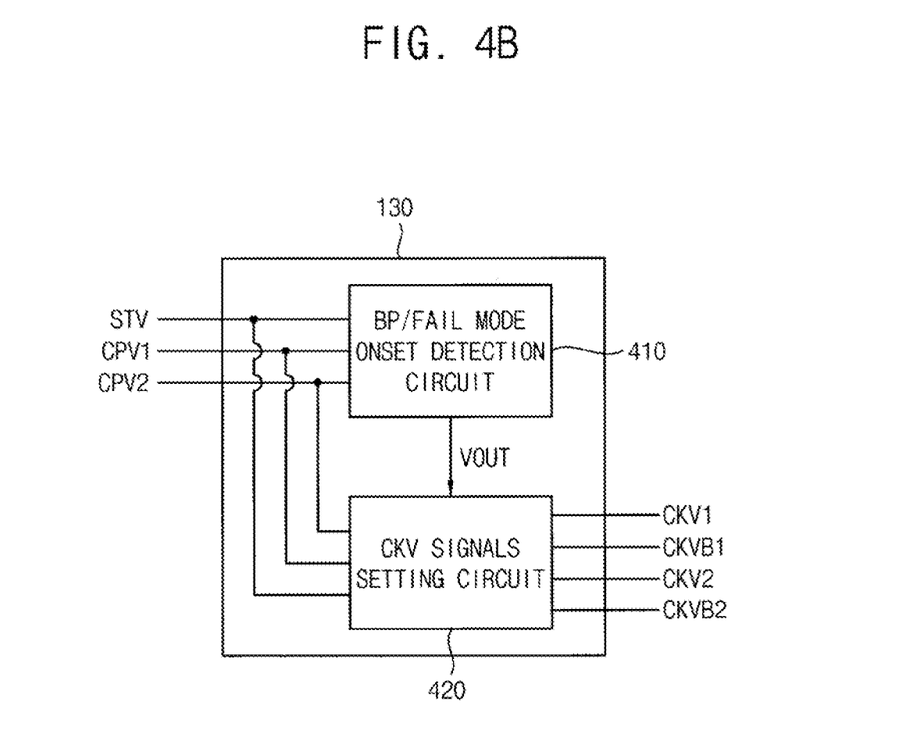
FIG. 4B is a block diagram illustrating example circuitry within the gate controller of FIG. 1.

FIG. 4B is a block diagram illustrating example circuitry within the gate controller 130 of FIG. 1. Gate controller 130 may include a blank period/fail mode onset detection circuit 410 that detects the onset of either of a blank period BP or a fail mode and provides an output signal VOUT having a voltage level indicative of the same. One example of detection circuit 410 is the detection circuit 400. Detection circuit 420 receives STV, CPV1 and CPV2 as inputs. As explained for detection circuit 420, VOUT may be a first logic level when all of STV, CPV1 and CPV2 are at a low level L1, otherwise, VOUT may be a second logic level. The output voltage VOUT may be provided to a CKV Signals setting circuit 420, which also receives STV, CPV1 and CPV2 as inputs. Circuit 420 sets the levels of each of CKV1, CKVB1, CKV2 and CKVB2 to the low level L2 if VOUT indicates that the blank period BP or the fail mode has begun. Setting circuit 420 maintains these levels at L2 so long as VOUT is at the first logic level, i.e., so long as all of STV, CPV1 and CPV2 are at the low level L1. If any one of STV, CPV1 and CPV2 is at the high level H1, Setting circuit 420 outputs the CKV Signals at their normal levels based on STV, CPV1 and CPV2.

FIGS. 5A and 5B are timing diagrams for describing examples of respective operations of the gate controller 130. In the examples of FIGS. 5A and 5B, the gate controller 130 may output the CKV Signals, i.e., the first clock signal CKV1, the first clock bar signal CKVB1, the second clock signal CKV2, and the second clock bar signal CKVB2, at the gate-off voltage L2 when the first control signal STV, the first clock control signal CPV1, and the second clock control signal CPV2 are provided to the gate controller 130 at the low level L1.

In FIG. 5A, STV, CPV1, CPV2 and STVP have the same waveforms as described above for FIG. 2. The gate controller 130 may generate the gate start signal STVP having the gate-on voltage H2 and the gate-off voltage L2 in response to the first control signal STV, generate CKV1 and CKVB1 that swing between the gate-on voltage H2 and the gate-off voltage L2 in response to CPV1, and generate CKV2 and CKVB2 that swing between the gate-on voltage H2 and the gate-off voltage L2 in response to CPV2. STV, CPV1, and CPV2 may be provided to the gate controller 130 at the low level L1 in the blank period BP of the frame. In a prior art display device as described above for FIG. 2, the voltage level of the CKV Signals may ramp up due to the charge sharing of the gate-on voltage H2 and the gate-off voltage L2 as the time in which CPV1 and CPV2 having the low level L1 are provided progresses. In accordance with the inventive concept, however, as shown in FIG. 5A, the gate controller 130 may generate the CKV Signals having the gate-off voltage L2 during the blank period BP. Thus, the operation of the gate driver because of the ramping of the voltage level of the CKV Signals may be prevented during the blank period BP. The gate controller 130 may thereafter generate CKV1 and CKVB1 corresponding to CPV1, and generate CKV2 and CKVB2 corresponding to CPV2 in response to the first control signal STV having the high level H1 after the blank period BP.

Referring to FIG. 5B, the first control signal STV having the high level H1 and the first clock control signal CPV1 and the second clock control signal CPV2 that swing between the high level H1 and the low level L1 may be provided to the gate controller 130 in the active frame AP of the frame. When the timing controller operates in a fail mode due to a changing of frame frequency or external shock (e.g., electrostatic discharge), the first clock control signal CPV1 and the second clock control signal CPV2 having the low level L1 may be provided to the gate controller 130. In prior art display devices, the voltage level of the CKV Signals may ramp up due to the charge sharing of the gate-on voltage H2 and the gate-off voltage L2 as the time in which the first clock control signal CPV1 and the second clock control signal CPV2 having the low level L1 are provided progresses. In accordance with the inventive concept, as illustrated in FIG. 5B, the gate controller 130 may generate the CKV Signals having the gate-off voltage L2 when all of STV, CPV1, and CPV2 are provided to the gate controller at the low level L1. Thus, the operation of the gate driver 140 due to the ramping of the voltage level of the CKV Signals may be prevented during the fail mode in which STV, CPV1, and CPV2 are provided at L1. The gate controller 130 may thereafter generate the CKV Signals that swing between the gate-on voltage H2 and the gate-off voltage L2 when CPV1 and CPV2 that swing between the high level H1 and the low level L1 are provided (i.e., after the fail mode).

As described above, the display device according to example embodiments may generate the first clock signal CKV1, the first clock bar signal CKVB1, the second clock signal CKV2, and the second clock bar signal CKVB2 having the gate-off voltage L2 when the first control signal STV, the first clock control signal CPV1, and the second clock control signal CPV2 have the low level L1 so that the ramping of the CKV signals and an operation of the gate driver due to the ramping of the CLK Signals may be prevented. Therefore, the display defect may not be displayed on the display panel.

Figure 6:
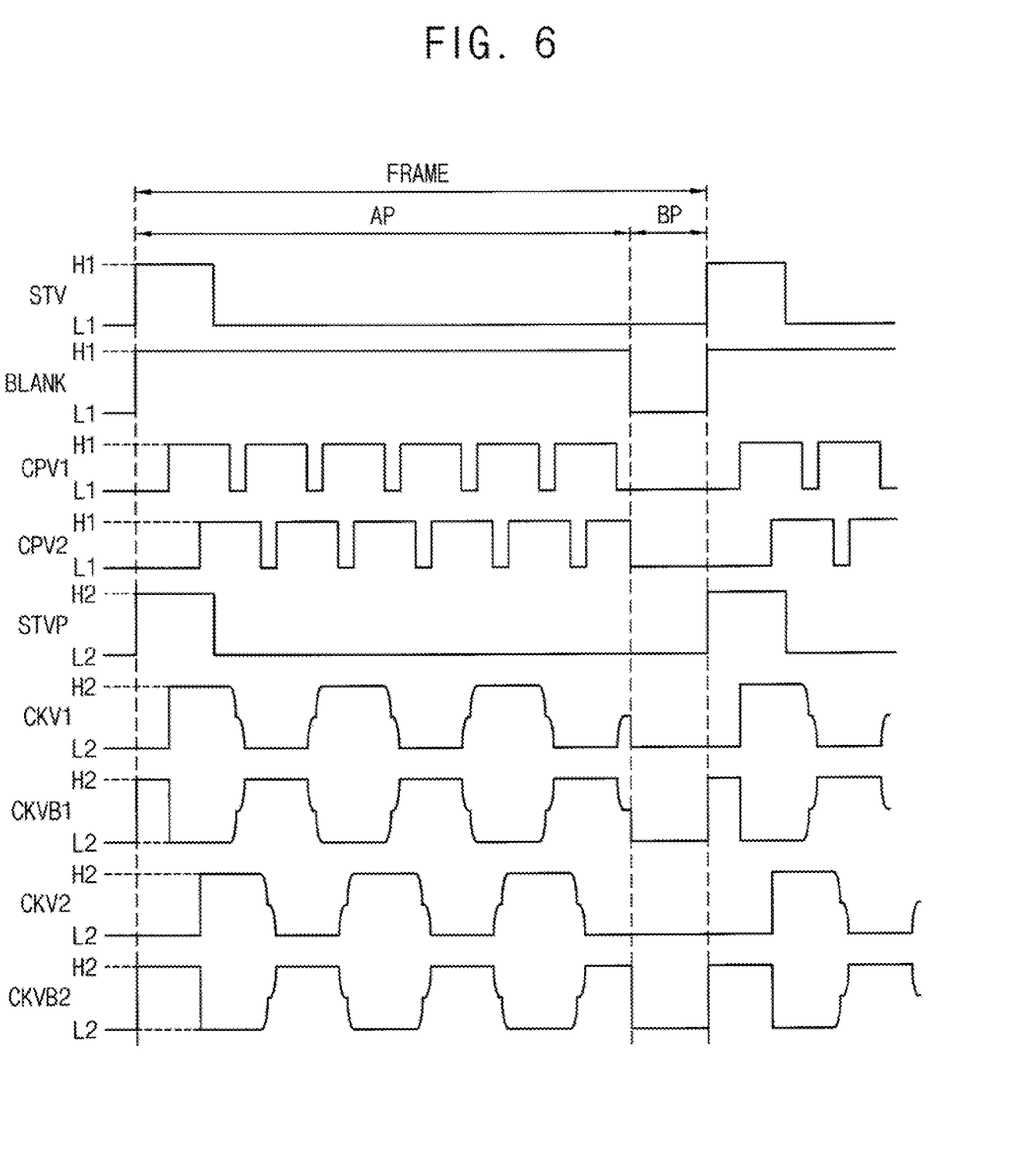
FIG. 6 is a timing diagram illustrating for describing another example of an operation of the gate controller included in the display device of FIG. 1.

FIG. 6 is a timing diagram illustrating for describing another example of an operation of the gate controller included in the display device of FIG. 1.

Referring to FIG. 6, the gate controller may receive a blank signal BLANK having the high level H1 in the active period AP and receive the blank signal BLANK having the low level L1 in the blank period BP. Alternatively, the gate controller may include a signal generator and generate the blank signal BLANK. The gate controller 130 may generate the gate start signal STVP having the gate-on voltage H2 and the gate-off voltage L2 in response to the first control signal STV in the active period AP, generate the first clock signal CKV1 and the first clock bar signal CKV B 1 that swing between the gate-on voltage H2 and the gate-off voltage in response to the first clock control signal CPV1, and generate the second clock signal CKV2 and the second clock bar signal CKVB2 that swing between the gate-on voltage H2 and the gate-off voltage L2. The gate controller 130 may receive STV, CPV1, CPV2, and the blank signal BLANK having the low level L1 during the blank period BP. The gate controller 130 may generate the gate start signal STVP having the gate-on voltage H2 and the gate-off voltage L2 in response to STV, generate CKV1 and CKVB1 that swing between the gate-on voltage H2 and the gate-off voltage L2 in response to CPV1, and generate CKV2 and CKVB2 that swing between the gate-on voltage H2 and the gate-off voltage L2 in response to CPV2 during the active period AP in which the blank signal BLANK having the high level H1 is provided to the gate controller 130. The gate controller 130 may generate the CKV Signals having the gate-off voltage L2 in response to the blank signal BLANK having the low level L1 in the blank period. For example, the blank signal BLANK may be a masking signal that masks the CKV Signals to the gate-off voltage L2. The gate controller 130 may output the CKV Signals having the gate-off voltage L2 based on the blank signal BLANK having the low level L1 during the blank period so that the operation of the gate driver in response to the CKV Signals of which voltage level ramps may be prevented.

Figure 7:
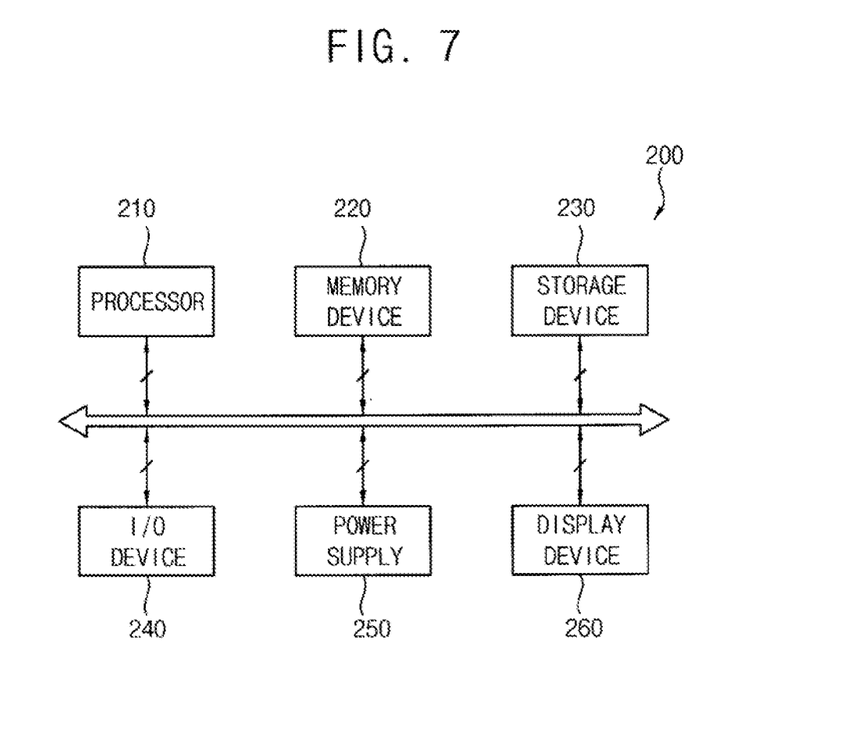
FIG. 7 is a block diagram illustrating an electronic device that includes the display device of FIG. 1.
Figure 8:
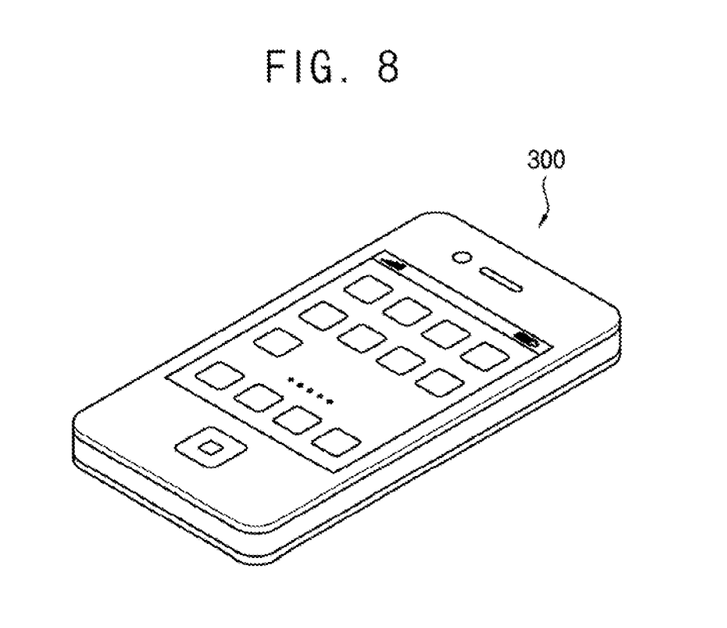
FIG. 8 is a diagram illustrating an example embodiment in which the electronic device of FIG. 7 is implemented as a smart phone.

FIG. 7 is a block diagram illustrating an electronic device that includes the display device of FIG. 1. FIG. 8 is a diagram illustrating an example embodiment in which the electronic device of FIG. 7 is implemented as a smart phone.

Referring to FIGS. 7 and 8, an electronic device 200 may include a processor 210, a memory device 220, a storage device 230, an input/output (I/O) device 240, a power device 250, and a display device 260. Here, the display device 260 may correspond to the display device 100 of FIG. 1. In addition, the electronic device 200 may further include a plurality of ports for communicating a video card, a sound card, a memory card, a universal serial bus (USB) device, other electronic device, etc. Note that the smart phone 300 is but one example of many types of electronic devices for which electronic device 200 may be used.

The processor 210 may perform various computing functions. The processor 210 may be a micro processor, a central processing unit (CPU), etc. The processor 210 may be coupled to other components via an address bus, a control bus, a data bus, etc. Further, the processor 210 may be coupled to an extended bus such as surrounded component interconnect (PCI) bus. The memory device 220 may store data for operations of the electronic device 200. For example, the memory device 220 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile DRAM device, etc. The storage device 230 may be a solid stage drive (SSD) device, a hard disk drive (HDD) device, a CD-ROM device, etc.

The I/O device 240 may be an input device such as a keyboard, a keypad, a touchpad, a touch-screen, a mouse, etc, and an output device such as a printer, a speaker, etc. In some example embodiments, the display device 260 may be included in the I/O device 240. The power device 250 may provide a power for operations of the electronic device 200. The display device 260 may communicate with other components via the buses or other communication links.

As described above, the display device 260 may include a display panel, a voltage generator, a gate controller, a gate driver, a data driver, and a timing controller. The display panel may include a plurality of data lines, a plurality of gate lines, and a plurality of pixels. The voltage generator may receive a direct current power and generate a plurality of voltages that need to operate the display panel. The voltage generator may generate a gate driving voltage provided to the gate controller, a data driving voltage provided to the data driver, and a panel driving voltage provide to the display panel. The voltage generator may generate the gate driving voltage that includes a gate-on voltage and a gate-off voltage and provide the gate driving voltage to the gate controller. The voltage generator may generate the data driving voltage that includes an analog power voltage, a digital power voltage, etc. and provide the data driving voltage to the data driver. The gate controller may generate gate clock signals based on the gate driving voltage and the gate control signals. The gate controller may receive the gate driving voltage that includes the gate-on voltage and the gate-off voltage. The gate controller may receive that gate control signals that include the first control signal and the clock control signals. The gate controller may generate the gate start signal using the gate-on voltage and the gate-off voltage in response to the first control signal provided from the timing controller. The gate controller may generate clock signals and the clock bar signals using the gate-on voltage and the gate-off voltage in response to the clock control signals provided from the timing controller. The gate controller may output a first clock signal, a first clock bar signal, a second clock signal, and a second clock bar signal having the gate-off voltage when the first control signal, the first clock control signal, and the second clock control signal are provided to the gate controller. For example, the gate controller may include a first OR gate that performs a logic calculation of the first clock control signal and the second clock control signal and a second OR gate that performs a logic calculation of an output signal of the first OR gate and the first control signal. In some example embodiments, the gate controller may generate the first clock signal, the first clock bar signal, the second clock signal, and the second clock bar signal having the gate-off voltage based on the first control signal, the first clock control signal, and the second clock signal having the low level in a blank period of a frame. In other example embodiments, the gate controller may generate the first clock signal, the first clock bar signal, the second clock signal, and the second clock bar signal having the gate-off voltage based on the first control signal, the first clock control signal, and the second clock signal having the low level during a fail mode when the timing controller is operated in the fail mode due to a changing of frame frequency, electrostatic discharge, etc. in an active period of the frame. In other example embodiments, the gate controller may output the first clock signal, the first clock bar signal, the second clock signal, and the second clock bar signal having the gate-off voltage based on a blank signal having the low level in the blank period of the frame. The gate driver may generate a gate signal based on the gate clock signals and provide the gate signal to the gate line. The data driver may provide the data signal to the pixels through the data line. The timing controller may generate the gate control signal that controls the gate controller and a data control signal that controls the data driver.

As described above, the electronic device of FIG. 7 may include the display device 260 having the gate controller that output the gate clock signals having the gate-off voltage when the first control signal and the clock control signals having the low level are provided. Thus, the display device 260 may prevent an increase of the voltage level of the gate clock signals due to the charge sharing of the gate-on voltage and the gate-off voltage. Thus, the display quality of the display device 260 included in the electronic device 200 may improve.

The present inventive concept may be applied to a display device and an electronic device having the display device. For example, the present inventive concept may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, etc.

Each of the above-described voltage generator, timing controller, gate controller, gate driver, and data driver is comprised of hardware circuitry. As such, each of these elements may be alternatively called a circuit. Any of these elements may include memory and at least one processor that reads instructions from the memory to carry out its respective functions.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims.

What is claimed is:

1. A display device comprising:
    a display panel including a plurality of gate lines, a plurality of data lines crossing the gate lines, and a plurality of pixels coupled to the gate lines and the data lines;
    a voltage generator configured to generate a gate driving voltage that varies between a gate-on voltage and a gate-off voltage;
    a gate controller configured to generate gate clock signals based on the gate driving voltage and gate control signals, the gate clock signals including a clock signal and a clock bar signal;
    a gate driver configured to generate gate signals based on the gate clock signals and to provide the gate signals to the gate lines;
    a data driver configured to provide data signals to the data lines; and
    a timing controller configured to provide the gate control signals to the gate controller and provide data control signals to the data driver,
    wherein the gate control signals include a first control signal, which is a vertical start signal, and clock control signals, each varying between a high level and a low level, and
    wherein the gate controller outputs the gate clock signals having a voltage level of the gate-off voltage in a blank period of a frame when the first control signal and the clock control signals are each provided to the gate controller at the low level.

2. The display device of claim 1, wherein the clock signal is a first clock signal, the clock bar signal is a first clock bar signal, and the clock control signals include a first clock control signal and a second clock control signal, and
    wherein the gate controller generates a gate start signal based on the gate driving voltage and the first control signal, generates the first clock signal and the first clock bar signal based on the gate driving voltage and the first clock control signal, and generates a second clock signal and a second clock bar signal based on the gate driving voltage and the second clock control signal.

3. The display device of claim 2, wherein each of the gate controller outputs the first clock signal, the first clock bar signal, the second clock signal, and the second clock bar signal at the voltage level of the gate-off voltage when the first control signal, the first clock control signal, and the second clock control signal are provided to the gate controller at the low level.

4. The display device of claim 2, wherein the gate controller includes:
    a first OR gate configured to perform a logic operation on the first clock control signal and the second clock control signal; and
    a second OR gate configured to perform a logic operation on the first control signal and an output signal of the first OR gate.

5. The display device of claim 2, wherein the gate controller outputs the first clock signal, the first clock bar signal, the second clock signal, and the second clock bar signal at the voltage level of the gate-off voltage in the blank period of the frame.

6. The display device of claim 2, wherein the gate controller outputs the first clock signal, the first clock bar signal, the second clock signal, and the second clock bar signal having the voltage level of the gate-off voltage when the timing controller is operated in a fail mode.

7. The display device of claim 2, wherein the gate controller outputs the first clock signal, the first clock bar signal, the second clock signal, and the second clock bar signal at the voltage level of the gate-off voltage based on a blank signal having a low level in the blank period of the frame.

8. The display device of claim 2, wherein the gate driver generates the gate signals based on the first clock signal, the first clock bar signal, the second clock signal, and the second clock bar signal.

9. The display device of claim 2, wherein each of the first clock signal, the first clock bar signal, the second clock signal, and the second clock bar signal swings between the gate-on voltage and the gate-off voltage.

10. The display device of claim 1, wherein the gate controller outputs each of the gate clock signals at the voltage level of the gate-off voltage when the timing controller operates in a fail mode.

11. A gate driving device comprising:
    a voltage generator configured to generate a gate driving voltage that varies between a gate-on voltage and a gate-off voltage;
    a gate controller configured to generate gate clock signals based on the gate driving voltage and gate control signals, the gate clock signals including a clock signal and a clock bar signal; and
    a gate driver configured to generate a gate signal based on the gate clock signals, and
    wherein the gate control signals include a first control signal, which is a vertical start signal, and clock control signals, each varying between a high level and a low level; and
    wherein the gate controller outputs the gate clock signals having a voltage level of the gate-off voltage in a blank period of a frame when the first control signal and the clock control signals are each provided to the gate controller at the low level.

12. The gate driving device of claim 11, wherein the clock signal is a first clock signal, the clock bar signal is a first clock bar signal, and the clock control signals include a first clock control signal and a second clock control signal, and
    wherein the gate controller generates a gate start signal based on the gate driving voltage and the first control signal, generates a first clock signal and a first clock bar signal based on the gate driving voltage and the first clock control signal, and generates a second clock signal and a second clock bar signal based on the gate driving voltage and the second clock control signal.

13. The gate driving device of claim 12, wherein the gate controller outputs each of the first clock signal, the first clock bar signal, the second clock signal, and the second clock bar signal at the voltage level of the gate-off voltage when the first control signal, the first clock control signal and the second clock control signal are each provided to the gate controller at the low level.

14. The gate driving device of claim 12, wherein the gate controller includes:
    a first OR gate configured to perform a logic operation on the first clock control signal and the second clock control signal; and
    a second OR gate configured to perform a logic operation on the first control signal and an output signal of the first OR gate.

15. The gate driving device of claim 12, wherein the gate controller outputs the first clock signal, the first clock bar signal, the second clock signal, and the second clock bar signal at the voltage level of the gate-off voltage in the blank period of the frame.

16. The gate driving device of claim 12, wherein the gate controller outputs the first clock signal, the first clock bar signal, the second clock signal, and the second clock bar signal at the voltage level of the gate-off voltage when the gate driving device is operated in a fail mode.

17. The gate driving device of claim 12, wherein the gate controller outputs the first clock signal, the first clock bar signal, the second clock signal, and the second clock bar signal at the voltage level of the gate-off voltage based on a blank signal having a low level in the blank period of the frame.

18. The gate driving device of claim 12, wherein the gate driver generates gate signals based on the first clock signal, the first clock bar signal, the second clock signal, and the second clock bar signal.

19. The gate driving device of claim 12, wherein each of the first clock signal, the first clock bar signal, the second clock signal, and the second clock bar signal swings between the gate-on voltage and the gate-off voltage.

20. A gate controller comprising:
a detection circuit configured to detect a start of a blank period of a frame and provide an output signal indicative thereof; and
a gate clock setting circuit configured to generate a plurality of gate clock signals responsive to control signals received thereby, and to set each of the plurality of gate clock signals to a gate-off voltage level when the output signal indicates that the blank period has started.

21. A gate controller comprising:
a detection circuit configured to detect a start of at least one of a blank period or a fail mode and provide an output signal indicative thereof; and
a gate clock setting circuit configured to generate a plurality of gate clock signals responsive to control signals received thereby, and to set each of the plurality of gate clock signals to a gate-off voltage level when the output signal indicates that the blank period or fail mode has started,
wherein the control signals include a plurality of clock control signals and a first control signal, which is a vertical start signal, and wherein the detection circuit comprises:
a first OR gate configured to perform a logic operation on the plurality of clock control signals; and
a second OR gate configured to perform a logic operation on the first control signal and an output of the first OR gate, to thereby provide the output signal.

* * * * *